(12) United States Patent
Terasawa

(10) Patent No.: US 7,130,018 B2
(45) Date of Patent: Oct. 31, 2006

(54) CATOPTRIC PROJECTION OPTICAL SYSTEM, EXPOSURE APPARATUS AND DEVICE FABRICATION METHOD

(75) Inventor: Chiaki Terasawa, Tochiqi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/746,575

(22) Filed: Dec. 24, 2003

(65) Prior Publication Data
US 2004/0189968 A1    Sep. 30, 2004

(30) Foreign Application Priority Data
Dec. 27, 2002   (JP)   .............. 2002-378776

(51) Int. Cl.
G03B 27/42    (2006.01)
(52) U.S. Cl. ............ 355/53; 355/53; 355/71; 355/67; 359/365; 359/857; 359/859; 378/34; 250/548
(58) Field of Classification Search ............ 355/45, 355/53, 67–71; 359/364–368, 729–731, 359/857–862; 378/34
See application file for complete search history.

(56) References Cited

U.S. PATENT DOCUMENTS

| | | | | |
|---|---|---|---|---|
| 5,686,728 | A * | 11/1997 | Shafer | 378/34 |
| 6,172,825 | B1 | 1/2001 | Takahashi | 359/859 |
| 6,353,470 | B1 | 3/2002 | Dinger | 355/71 |
| 6,600,552 | B1 | 7/2003 | Dinger | 355/67 |
| 2002/0056815 | A1 | 5/2002 | Mann et al. | 250/492.2 |
| 2002/0145718 | A1 | 10/2002 | Dinger | 355/67 |
| 2002/0154395 | A1 | 10/2002 | Mann et al. | 355/71 |
| 2004/0012866 | A1 * | 1/2004 | Mann et al. | 359/857 |
| 2004/0070743 | A1 * | 4/2004 | Hudyma et al. | 355/67 |

FOREIGN PATENT DOCUMENTS

| | | |
|---|---|---|
| JP | 10-90602 A | 4/1998 |
| JP | 2000-100694 A | 4/2000 |
| JP | 2000-235144 A | 8/2000 |
| JP | 2002-107630 | 4/2002 |
| JP | 2002-116382 | 4/2002 |
| JP | 2002-116382 A | 4/2002 |
| JP | 2000-139672 | 5/2002 |

OTHER PUBLICATIONS

An Office Action (Notice of Reasons for Rejection) dated Jun. 14, 2005 from Japanese Patent Office and translation.
Taiwanese Office Action dated Nov. 18, 2005 with English translation.
Japanese Office Action along with English translation dated May 30, 2006.

* cited by examiner

*Primary Examiner*—D. Rutledge
(74) *Attorney, Agent, or Firm*—Morgan & Finnegan, LLP

(57) ABSTRACT

A catoptric projection optical system for projecting a reduced size of a pattern on an object surface onto an image surface includes eight mirrors and forms an intermediate image between the sixth mirror and the seventh mirror on an optical path, wherein a position in a height direction of a principal ray from an optical axis at each mirror displaces, and a displacement direction from the first mirror to the fourth mirror is reverse to that from the fifth mirror to the eight mirror, wherein the second mirror to the fifth mirror are a concave mirror, a convex mirror, a concave mirror and a concave mirror, and the seventh mirror to the eighth are a convex mirror and a concave mirror, and wherein the second mirror of the eight mirrors is located closest to the object surface side.

29 Claims, 11 Drawing Sheets

CATOPTRIC PROJECTION OPTICAL SYSTEM, EXPOSURE APPARATUS AND DEVICE FABRICATION METHOD

This application claims a benefit of priority based on Japanese Patent Application No. 2002-378776, filed on Dec. 27, 2002, which is hereby incorporated by reference herein in its entirety as if fully set forth herein.

BACKGROUND OF THE INVENTION

The present invention relates generally to exposure apparatuses, and more particularly to a reflection type or catoptric projection optical system that uses ultraviolet ("UV") and extreme ultraviolet ("EUV") light to project and expose an object, such as a single crystal substrate for a semiconductor wafer, and a glass plate for a liquid crystal display ("LCD"), an exposure apparatus, and a device fabrication method.

Along with recent demands for smaller and lower profile electronic devices, finer semiconductor devices to be mounted onto these electronic devices have been increasingly demanded. For example, the design rule for mask patterns has required that an image with a size of a line and space ("L & S") of less than 0.1 μm be extensively formed and it is expected to require circuit patterns of less than 80 nm in the near future. L & S denotes an image projected onto a wafer in exposure with equal line and space widths, and serves as an index of exposure resolution.

A projection exposure apparatus as a typical exposure apparatus for fabricating semiconductor devices includes a projection optical system for projecting and exposing a pattern on a mask (reticle), onto a wafer. The resolution R of the projection exposure apparatus (i.e., a minimum size for a precise image transfer) can be defined using a light-source wavelength λ and the numerical aperture ("NA") of the projection optical system as in the following equation:

$$R = k_1 \times \frac{\lambda}{NA} \quad (1)$$

As the shorter the wavelength becomes and the higher the NA increases, the better the resolution becomes. The recent trend has required that the resolution be a smaller value; however it is difficult to meet this requirement using only the increased NA, and the improved resolution expects use of a shortened wavelength. Exposure light sources have currently been in transition from KrF excimer laser (with a wavelength of approximately 248 nm) and ArF excimer laser (with a wavelength of approximately 193 nm) to $F_2$ excimer laser (with a wavelength of approximately 157 nm). Practical use of the EUV light is being promoted as a light source.

As a shorter wavelength of light limits usable glass materials for transmitting the light, it is advantageous for the projection optical system to use reflection elements, i.e., mirrors instead of using many refraction elements, i.e., lenses. No applicable glass materials have been proposed for the EUV light as exposure light, and a projection optical system could not include any lenses. It has thus been proposed to form a catoptric reduction projection optical system only with mirrors.

A mirror in a catoptric reduction projection optical system forms a multilayer film to enhance reflected light and increase reflectance, but the smaller number of mirrors is desirable to increase reflectance of the entire optical system.

In addition, NA should be increased, for example, p to 0.2 for a wavelength of 13.5 nm, since a critical dimension (resolution) required for the EUV exposure apparatus has been smaller than the conventional values. However, it is difficult to reduce the wave front aberration in the conventional three- or four-mirror system. Accordingly, a demand has occurred to increase the number of mirrors as well as making a mirror aspheric so as to increase the degree of freedom in correcting the wave front aberration.

For example, Japanese Patent Publication Applications Nos. 2000-100694 and 2000-235144 disclose a catoptric reduction optical system that includes about six mirrors (sometimes expressed as a six-mirror system hereinafter). Japanese Patent Publication Application No. 10-90602 discloses a catoptric reduction projection optical system that uses six or eight mirrors and has NA of about 0.45. Japanese Patent Publication Application No. 2002-116382 discloses another example of a catoptric reduction projection optical system that uses eight mirrors and has NA of about 0.25.

The six-mirror system proposed in Japanese Patent Publication Application No. 2000-100694 reflects a principal ray near a vertex of a first mirror, and tends to cause large telecentricity at the object side, i.e., an angle between the principal ray incident upon the first mirror and an optical axis. Thus, an offset of an object-surface position in the optical-axis direction at the time of scan exposure would cause the magnification and distortion on the image surface to easily vary and the imaging performance to deteriorate.

Another disadvantage is that it handles NA up to about 0.16 but the six-mirror system has an insufficient degree of freedom in correcting aberration and a difficulty in handling higher NA up to about 0.5. This is because a second reflection system from an intermediate image to the image surface includes as many as four mirrors, and it becomes difficult to arrange these mirrors without interfering with light other than the reflected light as the high NA thickens a beam width in the second reflection optical system. Although a high principal-ray point in the second reflection optical system, in particular, at the third and forth mirrors might enable these mirrors to be arranged without interference, the second mirror as a concave mirror hinders the arrangement. It is conceivable that the object point is made higher to handle the higher NA, but a wider angle is incompatible with a correction of aberration as well as causing a large mirror size.

Since a minimum distance between the object surface and the mirror is as short as about 20 to 30 mm, it is difficult to maintain a space for a stage mechanism for scanning the object surface. Thus, the illumination light disadvantageously interferes with the stage mechanism when the illumination system is arranged so that it crosses the optical axis of the projection optical system.

The six-mirror catoptric projection optical system as proposed in Japanese Patent Publication Application No. 2000-235144, the minimum distance between the object surface and the mirror is so short as about 80 to 85 mm, and thus it is still difficult to maintain a space for a stage mechanism for scanning the object surface. Therefore, the illumination light disadvantageously interferes with the stage mechanism when the illumination system is arranged so that it crosses the optical axis of the projection optical system.

The six-mirror has an insufficient degree of freedom in correcting aberration, and cannot provide sufficient performance, even when seeking for higher NA, e.g., about 0.5. In addition, in order to avoid interference of light at the fifth and sixth mirrors in the higher NA, an angle of a principal ray relative to the optical axis must be increases between the fourth and fifth mirrors and an effective diameter of a fourth mirror disadvantageously increases.

The projection optical system proposed in Japanese Patent Publication Application No. 10-90602 does not clearly describe its performance and is an optical system for UV light having a wavelength between 100 to 300 nm. Therefore, aberration must be reduced down to about $\frac{1}{10}$ in order to use this optical system for the EUV light, which is difficult in correcting aberration.

The six-mirror system has problems similar to those associated with Japanese Patent Publication Application No. 2000-235144, and the eight-mirror system shown in FIG. 11 is also disadvantageous. Although this reference discloses an optical system having NA of 0.5, an actual measurement reveals that NA is about 0.4 and reflective surfaces 1100 and 1200 have such a large incident angle as about 56° and 54°, respectively. This is because a reflective surface 1300 forms a concave mirror, a reflective surface 1400 forms a convex mirror, and an aperture stop 1500 is formed between them. Since light from an object is greatly reflected on the reflective surface 1300 of positive power in an optical-axis direction and then reflected, through the aperture stop 1500, on the reflective surface 1400 of negative power at a portion below the optical axis, an incident angle upon the reflective surface 1100 as a convex mirror. Here, FIG. 11 is a schematic sectional view of a conventional eight-mirror catoptric projection optical system 1000.

In addition, distances X and Y become short, because the light from a reflective surface 1600 to a reflective surface 1700 is reflected so that it approaches to the optical axis and a reflective surface 1200 is located closer to the image surface than a reflective surface 1800. Therefore, reflections with strong power in small space would increase an incident angle upon the reflective surface 1200. Use of the EUV light with a large incident angle is incompatible with an angular characteristic of a multilayer film layered on the mirror, causing reduced light intensity, non-uniform light intensity, and non-uniform resolution on a wafer surface. Moreover, it is doubtful that the optical system has performance of resolution limit as a whole due to increased telecentricity at the side of wafer.

The projection optical system proposed in Japanese Patent Publication Application No. 2002-116382 enables an eight-mirror system to have NA of about 0.25. However, this is also disadvantageous in that a configuration generally arranges the fourth mirror closest to a mask side, and thus a diameter of the fourth mirror easily increases. In addition, since beams cross in the optical path in FIGS. 2, 6, 8 and 10, and higher NA would cause interference between the light and the mirror(s).

In other words, a catoptric projection optical system having high NA suitable for the EUV light, e.g., greater than about 0.25 or about 0.3 to 0.5 has not yet been proposed.

BRIEF SUMMARY OF THE INVENTION

Accordingly, it is an exemplified object of the present invention to provide a catoptric projection optical system that has eight mirrors and provides high NA and good imaging performance, an exposure apparatus, and a device fabrication method.

A catoptric projection optical system of one embodiment according to the present invention for projecting a reduced size of a pattern on an object surface onto an image surface includes eight mirrors that includes, in order from the object surface side to the image surface side, a first mirror, a second mirror, a third mirror, a fourth mirror, a fifth mirror, a sixth mirror, a seventh mirror, and an eighth mirror, and forming an intermediate image between the sixth mirror and the seventh mirror on an optical path, wherein a position in a height direction of a principal ray from an optical axis at each mirror displaces, and a displacement direction from the first mirror to the fourth mirror is reverse to that from the fifth mirror to the eight mirror, wherein the second to fifth mirrors are concave, convex, concave and concave mirrors, respectively, and the seventh and eighth mirrors are convex and concave mirrors, respectively, and wherein the second mirror among these eight mirrors is located closest to the object surface side.

The largest incident angle upon a meridional section may be equal to or smaller than 45° on an effective light reflective surface from the first mirror to the sixth mirror. The projection optical system may meet $0.45<|d2/d1|<0.8$, where d1 is a distance from the object surface to the first mirror, and d2 is a distance from the first mirror to the second mirror. The projection optical system may meet $1.0<|d7/d8|<1.2$, where d7 is a distance from the sixth mirror to the seventh mirror, and d8 is a distance from the seventh mirror to the eighth mirror.

The projection optical system may meet $0.75<|d6/d8|<1.2$, where d6 is a distance from the fifth mirror to the sixth mirror, and d8 is a distance from the seventh mirror to the eighth mirror. The projection optical system may meet $0.3<|d4/d3|<1.0$, where d3 is a distance from the second mirror to the third mirror, and d4 is a distance from the third mirror to the fourth mirror. The projection optical system may meet $-5.0<\alpha<10.0$, where $\alpha$ is an angle (degree) between the principal ray at the largest image point from the fourth mirror to the fifth mirror, and the optical axis, and clockwise and counterclockwise rotations from a parallel line to the optical axis which starts from a principal ray position at the fifth mirror are defined as positive and negative, respectively.

The sixth mirror may be a convex mirror. An optical-axis position of the sixth mirror may be physically located closer to the image surface than an optical-axis position of the first mirror. A position of the second mirror may be an aperture stop position. The eight mirrors are substantially arranged as a coaxial system.

At least one of the eight mirrors may include an aspheric mirror including a multilayer film for reflecting extreme ultraviolet light. All of the eight mirrors may include aspheric mirrors each including a multilayer film for reflecting extreme ultraviolet light.

The light may be extreme ultraviolet light having a wavelength of 20 nm or smaller. The projection optical system may have a numerical aperture of 0.3 or greater. The catoptric projection optical system may be telecentric at the image surface side.

An exposure apparatus of another aspect according to the present invention includes the above catoptric projection optical system, a stage for positioning a mask at the object surface and for holding the mask, a stage for positioning at the image surface a photosensitive layer of an object to be exposed, and for holding the object, an illumination apparatus that illuminates the mask using arc-shaped EUV light having an arc-shaped field of the catoptric projection optical system, and a mechanism for synchronously scanning each stage while the mask is illuminated by the EUV light.

A device fabrication method of still another aspect according to the present invention includes the steps of exposing an object using the above exposure apparatus, and developing the object that is exposed. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
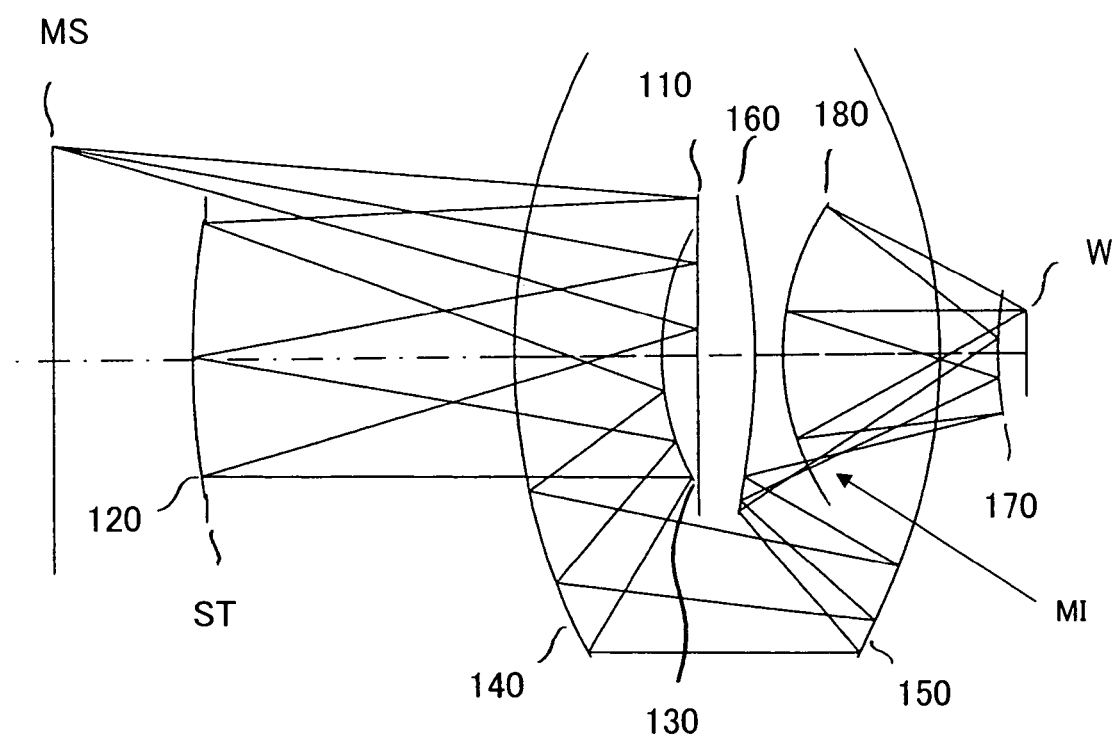
FIG. 1 is a schematic sectional view showing a catoptric projection optical system and its optical path of one embodiment according to the present invention.
Figure 2:
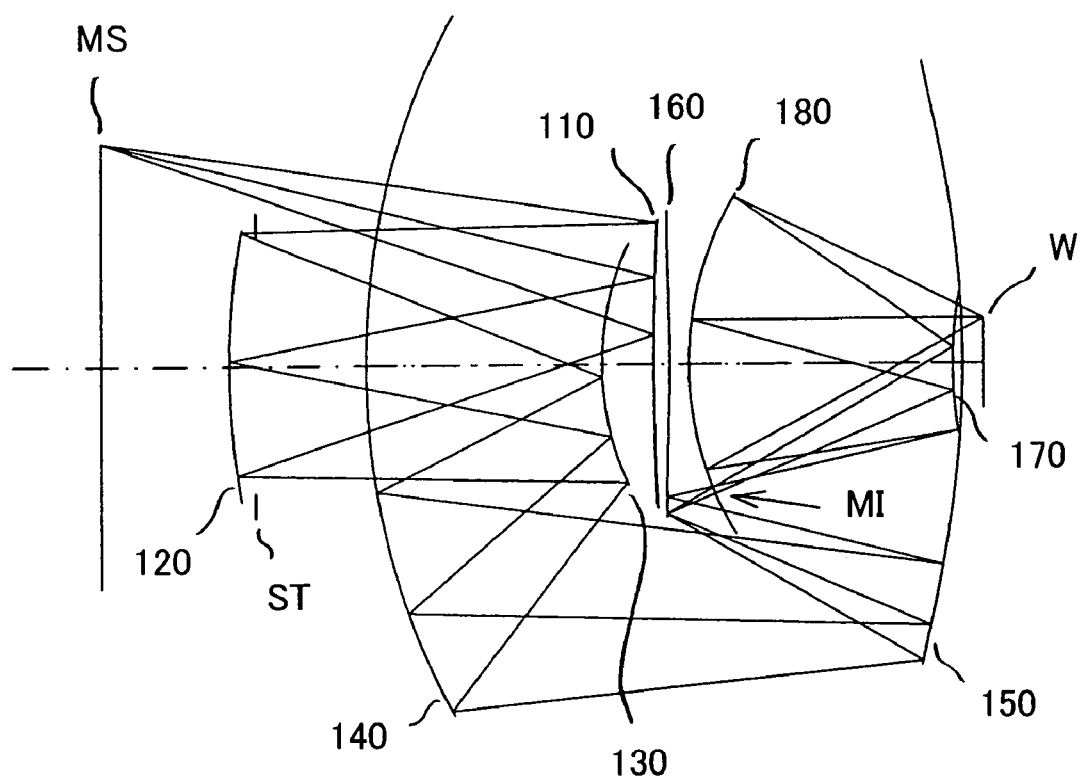
FIG. 2 is a schematic sectional view showing a variation of the catoptric projection optical system shown in FIG. 1.
Figure 3:
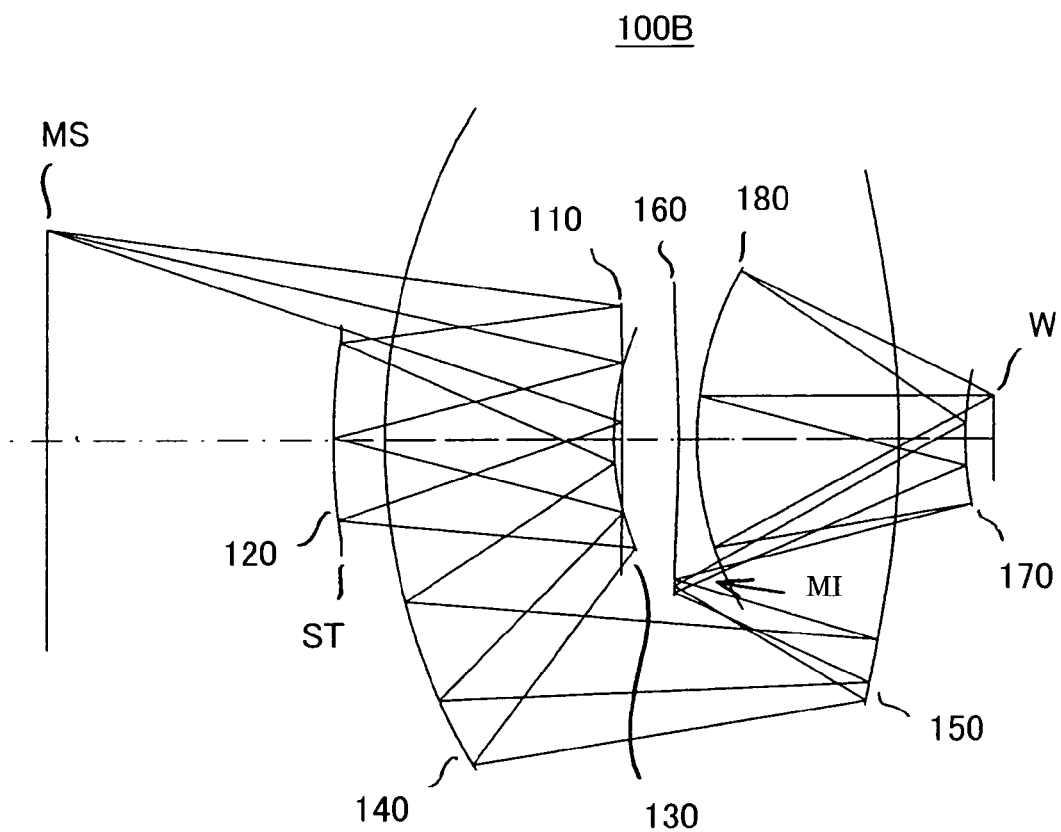
FIG. 3 is a schematic sectional view showing a variation of the catoptric projection optical system shown in FIG. 1.
Figure 4:
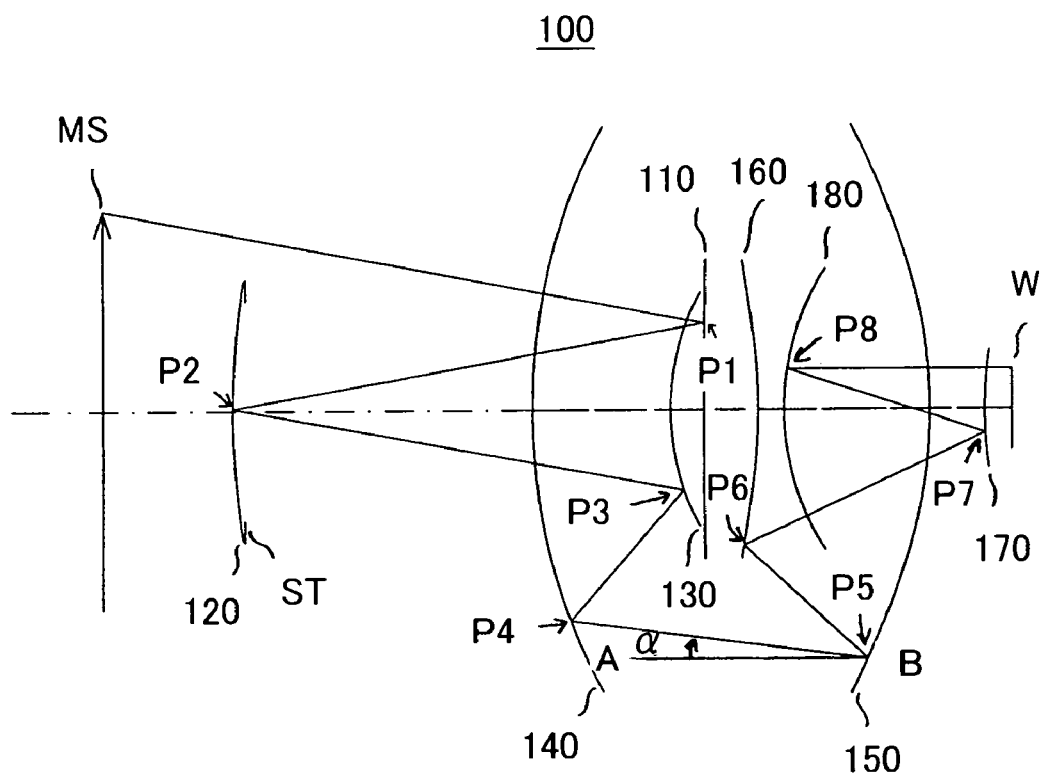
FIG. 4 is a schematic sectional view showing an optical path of a principal ray of the catoptric projection optical system shown in FIG. 1.

A description will now be given of a catoptric projection optical system 100 and an exposure apparatus 200 as one aspect of the present invention with reference to the accompanying drawings. The present invention is not limited to these embodiments and each element is replaceable within a scope that achieves the objects of the present invention. The same reference numeral in each figure denotes the same element, and a description thereof will be omitted. Here, FIG. 1 is a schematic sectional view showing the catoptric projection optical system 100 and its optical path of one embodiment according to the present invention. FIG. 2 is a schematic sectional view showing a catoptric projection optical system 100A and its path as a variation of the catoptric reduction projection optical system 100 shown in FIG. 1. FIG. 3 is a schematic sectional view showing a catoptric projection optical system 100B and its path as a variation of the catoptric reduction projection optical system 100 shown in FIG. 1. Unless otherwise specified, the catoptric projection optical system 100 generalizes the catoptric reduction projection optical systems 100A and 100B. FIG. 4 is a schematic sectional view showing an optical path of a principal ray of the catoptric projection optical system 100 shown in FIG. 1.

Referring to FIG. 1, the inventive catoptric projection optical system 100 (hereinafter simply called "projection optical system 100") reduces and projects a pattern on an object surface MS, such as a mask surface, onto an image surface W, such as a substrate surface and an object surface to be exposed. The catoptric projection optical system 100 is an optical system particularly suitable for the EUV light (with a wavelength of, for example, 13.4 nm), and realizes much higher numerical aperture ("NA"), such as 0.5, than a conventional catoptric reduction projection optical system.

The projection optical system 100 includes eight mirrors that substantially includes, in order of reflecting light from the off-axis, ring-shaped object surface MS, a first mirror 110, a second (concave) mirror 120, a third (convex) mirror 130, a fourth (concave) mirror 140, a fifth (concave) mirror 150, a sixth mirror 160, a seventh (concave) mirror 170, and an eighth (concave) mirror. The six mirrors including the first mirror 110 to the sixth mirror 160 form an intermediate image MI, and this intermediate image MI is re-imaged on the image surface W using two mirrors that include the seventh mirror 170 and the eighth mirror 180. Although aberration is seen near the intermediate image MI, it images between the sixth mirror 160 and the seventh mirror 170 as the light is stopped. Here, it is preferable that light projected by this projection optical system is composed of off-axis light from the object surface MS.

The inventive projection optical system 100 is arranged substantially as a coaxial system, i.e., a coaxial optical system that is axially symmetrical around one optical axis. In other words, a coaxial system refers to an optical system in which centers of curvatures of all the optical surfaces in the optical system 100 are aligned substantially with the optical axis even when the centers of curvatures offset from the optical axis. Further, an intersection between an optical axis and each optical surface or an extended surface of each optical surface will be referred to as an "optical-axis position of each optical surface".

An aperture stop ST is located at a position of the second mirror 120. The aperture stop ST may have a fixed or variable diameter. NA of the optical system is variable by changing the variable diameter of the aperture stop ST. The aperture stop ST as a variable stop advantageously provides a deeper depth of focus suitable for stabilization of images.

In such a configuration, the inventive projection optical system 100 provides the second mirror 120 with a concave mirror of positive power, and arranges the aperture stop ST at the position of the mirror, reducing an incident angle upon the subsequent mirrors, or the third mirror 130 to the eighth mirror 180.

The fourth mirror 140 is prevented from having an increased diameter by arranging the second mirror 120 located at an aperture stop position closest to the mask MS and restricting a position of the fourth mirror 140.

The inventive projection optical system 100 is characterized, as shown in FIG. 4, in that with respect to positions P1 to P8 in a height direction of a principal ray, which has been emitted from the object surface MS in the positive direction, from the optical axis at each mirror, a displacement direction from the first mirror 110 to the fourth mirror 140 is a negative direction, like P1, P2, P3 and P4 in this order, or a direction from a front surface to a rear surface of the paper surface, while a displacement direction from the fifth mirror 150 to the eighth mirror 180 is a positive direction, like P5, P6, P7 and P8 in this order, or a direction from the rear surface to the front surface of the paper surface.

In other words, an angle of a principal ray is reduced between the fourth (concave) mirror 140 and the fifth (concave) mirror 150 so as to create a condition approximately parallel to the optical axis, the fourth (concave) mirror 140 and the fifth (concave) mirror 150 are prevented from having an effective diameter excessively larger than the other and have the balanced, equal effective diameter. This also serves to balance the incident angles upon these mirrors, reducing an increase of the incident angle.

In general, in an attempt to achieve high NA in the reflection optical system, an optical path for reflected light hard to be secured, and the incident angle increases when each mirror has strengthened power. For such high NA, the inventive projection optical system 100 maintains the incident angle smaller than 45° for the first mirror 110 to the sixth mirror 160 while maintaining high NA or the NA of about 0.5.

Preferably, the incident angle is as small as possible, more preferably, smaller than 30° in view of property of the multilayer film in the mirror surface. An incident angle upon the seventh (convex) mirror 170 tends to increase so as to set an angle of ray to the sixth mirror 160 and the seventh mirror 170 so that an optical path can be secured and light near the intermediate image MI and the eighth mirror 180 do no interfere with each other. The eighth mirror 180 is made a concave mirror with large power that makes an effective diameter as large as possible so as to ultimately form an image at desired NA and facilitate securing the optical path. Its incident angle is not problematic since it has a magnification relationship close to an equimultiple and makes the image point as low as possible in a range that does not cause interference of light. Upon condition that NA is so small as 0.4 or 0.3, the optical path may be more easily maintained and an incident angle upon each of all the reflective surfaces may be made small.

Thus, the inventive projection optical system 100 may achieve such an extremely high NA as about 0.5, more preferably one that meets following Equations 2 to 6.

The inventive projection optical system 100 preferably meets Equation 2 below:

$$0.45 < |d2/d1| < 0.8 \qquad (2)$$

where d1 is a distance from the object surface MS to the first mirror 110, and d2 is a distance from the first mirror 110 to the second mirror 120.

Equation 2 defines a positional relationship between the first mirror 110 and the second mirror 120. When the value becomes lower than the lower limit, the telecentricity at the object side deteriorates, and this undesirably causes a change of an image size and deteriorates distortion as the object surface MS moves in the optical axis direction due to manufacture errors, etc. On the other hand, the value higher than the upper limit would shorten a distance between the object surface MS and the second mirror 120, undesirably making it difficult to arrange the drive stage in a certain space and restricting the optical path in the illumination system.

The inventive projection optical system 100 preferably meets Equation 3 below:

$$1.0 < |d7/d8| < 1.2 \qquad (3)$$

where d7 is a distance from the sixth mirror 160 to the seventh mirror 170, and d8 is a distance from the seventh mirror 170 to the eighth mirror 180.

Equation 3 defines a positional relationship among the sixth mirror 160, the seventh mirror 170 and the eighth mirror 180. When the value becomes lower than the lower limit, the sixth mirror 160 is located closer to the image surface W than the eighth mirror 180, and an incident angle upon the sixth mirror 160 increases. In addition, the fifth mirror 150 undesirably has increased power to reflect light and an increased incident angle, due to the limited arrangement space at the side of the image surface W. On the other hand, when the value becomes higher than the upper limit, the sixth mirror 160 is located closer to the object surface MS, and effective diameters of the fourth mirror 140 and the fifth mirror 150 increase, which is undesirable for a configuration of the optical system.

The inventive projection optical system 100 preferably meets Equation 4 below:

$$0.75 < |d6/d8| < 1.2 \qquad (4)$$

where d6 is a distance from the fifth mirror 150 to the sixth mirror 160, and d8 is a distance from the seventh mirror 170 to the eighth mirror 180.

Equation 4 defines a relationship between a distance between the fifth mirror 150 and the sixth mirror 160, and a distance between the seventh mirror 170 and the eighth mirror 180. When the value becomes lower than the lower limit, light should be reflected in a narrow interval between the fifth mirror 150 and the sixth mirror 160, and an incident angle upon each mirror undesirably increases. On the other hand, when the value becomes higher than the upper limit, it is difficult to secure an optical path between the fifth mirror 150 and the sixth mirror 160, and their effective diameters undesirably increase.

The inventive projection optical system 100 preferably meets Equation 5 below:

$$0.3 < |d4/d3| < 1.0 \tag{5}$$

where d3 is a distance from the second mirror 120 to the third mirror 130, and d4 is a distance from the third mirror 130 to the fourth mirror 140.

Equation 5 defines a positional relationship among the second mirror 120, the third mirror 130 and the fourth mirror 140. When the value becomes lower than the lower limit, light should be reflected in a narrow interval between the third mirror 130 and the fourth mirror 140, and an incident angle upon each mirror undesirably increases. On the other hand, when the value becomes higher than the upper limit, the fourth mirror 140 undesirably has an increased effective diameter. When the upper limit is set to be 0.9, the effective diameter may be made smaller.

The inventive projection optical system 100 preferably meets Equation 6 below:

$$-5.0 < \alpha < 10.0 \tag{6}$$

where α is an angle (degree) between the principal ray at the largest image point from the fourth mirror 140 to the fifth mirror 150, and the optical axis, and clockwise and counterclockwise rotations from a parallel line to the optical axis which starts from a principal ray position at the fifth mirror 150 are defined as positive and negative, respectively.

Equation 6 defines the angle a shown in FIG. 4, which is an angle relative to a segment AB parallel to the optical axis that starts from a principal ray position B on the fifth mirror 150. A balance loses between effective diameters of the fourth mirror 140 and the fifth mirror 150 when the value becomes lower than the lower limit or higher than the upper limit. In particular, when it exceeds the lower limit, the fourth mirror 140 would have an increased effective diameter and it becomes undesirably difficult to secure an optical path at the fifth mirror 150 and the sixth mirror 160. On the other hand, when the value becomes higher than the upper limit, the fifth mirror 150 would have an increased effective diameter and the sixth mirror 160 has a desirably large incident angle. More preferably, the angle a meets Equation 7 below:

$$0 < \alpha < 10.0 \tag{7}$$

This is because a diameter balance increases when an angle of a principal ray holds a positive value since a beam constricts between the fourth mirror 140 and the fifth mirror 150.

Moreover, the instant projection optical system 100 simplifies an arrangement of mirrors and a structure of mirror barrel by arranging an optical axis position of the sixth mirror 160 closer to the image surface W side than an optical axis position of the first mirror 110.

Referring now to FIG. 2, a description will be mainly given of differences of the catoptric projection optical system 100A as a variation of the catoptric projection optical system 100 shown in FIG. 1, from the catoptric projection optical system 100. The projection optical system 100A arranges, on the optical axis, optical-axis center positions of seven mirrors except for the fourth mirror 140. Therefore, each seven mirrors may have a shape having a 360° area that contains the optical axis center, which is advantageous in view of manufacture purposes, such as an adjustment of decentering.

In such a configuration, the inventive projection optical system 100A is an eight-mirror system that is advantageous for extreme high NA. In addition, the outgoing light is maintained telecentric at the side of the image surface W, and the magnifying power is less affected even when the image surface W moves along the optical-axis direction.

As the projection optical system 100A is arranged as a coaxial system, it may advantageously correct aberration in the ring-shaped image surface around the optical axis as a center. The projection optical system 100A is an intermediate-image forming optical system, and provides well-balanced aberrational corrections. The projection optical system 100A of a mirror type is compatible with both a transmission type mask (i.e., a die-cut mask) and a catoptric mask.

The first to eighth mirrors 110 to 180 are made of concave or convex mirrors, as discussed above. The first mirror 110 and the sixth mirror 160 can have any one of positive and negative powers, or are made of a concave or convex mirror. Of course, a mirror shape in the entire projection optical system 100A should be determined as described later so that the sum of the Petzval terms may be zero or in the neighborhood of zero. Preferably, since the second mirror 120 is a concave mirror, the first mirror 110 is a convex mirror; since the third mirror 130 is a convex mirror, the fourth mirror 140 is a concave mirror; since the fifth mirror 150 is a concave mirror, the sixth mirror 160 is a convex mirror; since the eighth mirror 180 is a convex mirror, the seventh mirror 170 is a concave mirror. This is because the sum of the Petzval terms from the first mirror 110 to the eighth mirror 180 is partially correctable.

Although the instant embodiment makes, as described above, the first mirror 110 to the eighth mirror 180 of concave and convex mirrors, and their reflection surfaces of aspheric shapes, at least one or more mirrors out of the first to eight mirrors 110 to 180 have an aspheric surface according to the present invention. As a mirror having an aspheric surface advantageously facilitates a correction of aberration, the aspheric surface is preferably applied to many possible (desirably, eight) mirrors. A shape of the aspheric surface in these first to eighth mirrors 110 to 180 is defined as Equation 8 as an equation of a generic aspheric surface:

$$Z = \frac{ch^2}{1 + \sqrt{1 - (1+k)c^2h^2}} + Ah^4 + Bh^6 + Ch^8 + Dh^{10} + \\ Eh^{12} + Fh^{14} + Gh^{16} + Hh^{18} + Jh^{20} + \ldots \tag{8}$$

where "Z" is a coordinate in an optical-axis direction, "c" is a curvature (i.e., a reciprocal number of the radius r of curvature), "h" is a height from the optical axis, "k" a conic constant, "A" to "J" are aspheric coefficients of $4^{th}$ order, $6^{th}$ order, $8^{th}$ order, $10^{th}$ order, $12^{th}$ order, $14^{th}$ order, $16^{th}$ order, $18^{th}$ order, $20^{th}$ order, respectively.

These eight, i.e., first to eighth mirrors 110 to 180 have the sum of the Petzval terms in the neighborhood of zero or preferably zero in order to flatten the image surface W in the optical system. Thereby, a sum of refracting power of each mirror surface is made nearly zero. In other words, where $r_{110} \sim r_{180}$ are the radii of curvature for respective mirrors (in which subscripts correspond to the reference numerals of the mirrors), the first to eight mirrors 110 to 180 in this embodiment meet Equation 9 or 10:

$$\frac{1}{r_{110}} - \frac{1}{r_{120}} + \frac{1}{r_{130}} - \frac{1}{r_{140}} + \frac{1}{r_{150}} - \frac{1}{r_{160}} + \frac{1}{r_{170}} - \frac{1}{r_{180}} = 0 \quad (9)$$

$$\frac{1}{r_{110}} - \frac{1}{r_{120}} + \frac{1}{r_{130}} - \frac{1}{r_{140}} + \frac{1}{r_{150}} - \frac{1}{r_{160}} + \frac{1}{r_{170}} - \frac{1}{r_{180}} \approx 0 \quad (10)$$

A multilayer film for reflecting the EUV light is applied onto the surface of the first to eighth mirrors 110 to 180, and serves to enhance the light. A multilayer applicable to the mirrors 110 to 140 of the instant embodiment includes, for example, a Mo/Si multilayer film including alternately laminated molybdenum (Mo) and silicon (Si) layers on a mirror's reflection surface or a Mo/Be multilayer film including alternately laminating molybdenum (Mo) and beryllium (Be) layers on the mirror's reflection surface. A mirror including the Mo/Si multilayer film may obtain reflectance of 67.5% for a wavelength range near a wavelength of 13.4 nm, and a mirror including the Mo/Be multilayer film may obtain reflectance of 70.2% for a wavelength range near a wavelength of 11.3 nm. Of course, the present invention does not limit the multilayer film to the above materials, and may use any multilayer film that has an operation or effect similar to that of the above.

Figure 5:
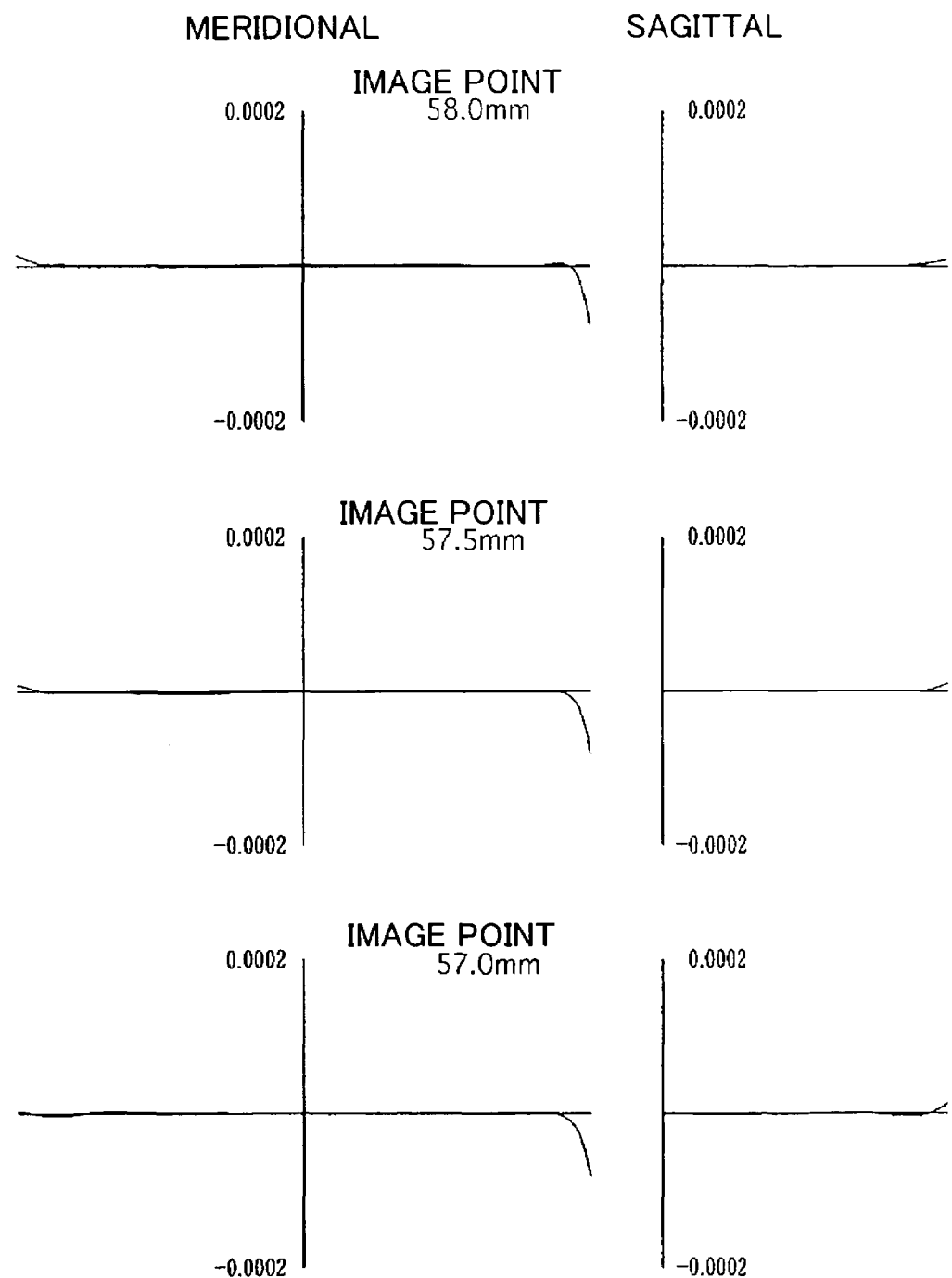
FIG. 5 is an aberrational diagram of the catoptric projection optical system shown in FIG. 1.

A description will now be given of results of illumination experiments using the inventive catoptric projection optical systems 100, 100A and 100B. In FIGS. 1 to 3, MS is a catoptric mask located at the object surface and W is a wafer located at the image surface. The catoptric projection optical systems 100, 100A and 100B illuminate the mask MS using an illumination system (not shown) for emitting the EUV light with a wavelength of about 13.4 nm, and reflects the reflected EUV light from the mask MS via the first mirror 110, the second (concave) mirror 120, the third (convex) mirror 130, and fourth (concave) mirror 140, the fifth (concave) mirror 150, the sixth mirror 160, and the seventh (convex) mirror 170, and the eighth (concave) mirror 180 arranged in this order. Then, a reduced image of the mask pattern is formed on the wafer W located at the image surface. The catoptric projection optical system 100 shown in FIG. 1 has NA=0.50, span=1330 mm, reduction=⅕, object point of 285 to 290 mm, an image point of 57 to 58 mm, and an arc-shaped image surface with a width of 1.0 mm. Table 1 indicates the numerical values (such as radius of curvature, surface intervals, coefficients of aspheric surfaces, and values in a conditional expression) of the catoptric projection optical system 100 shown in FIG. 1. FIG. 5 shows an aberrational diagram of the catoptric projection optical system 100 shown in FIG. 1.

TABLE 1

| MIRROR | RADII OF CURVATURE | SURFACE INTERVALS | |
|---|---|---|---|
| OBJECT SURFACE (MS) | ∞ | 883.58485 | d1 |
| MIRROR 110 | 163266.04958 | −692.98779 | d2 |
| MIRROR 120 | 1181.80828 | 17.92655 | d3 |
| | | | (=634.14081) |
| STOP (ST) | ∞ | 625.21426 | |
| MIRROR 130 | 358.74702 | −203.92789 | d4 |
| MIRROR 140 | 883.55856 | 581.06761 | d5 |
| MIRROR 150 | −723.01688 | −247.73207 | d6 |
| MIRROR 160 | −702.14261 | 327.72165 | d7 |
| MIRROR 170 | 539.31155 | −290.81170 | d8 |
| MIRROR 180 | 376.73249 | 330.81170 | |
| IMAGE SURFACE (W) | ∞ | | |

| COEFFICIENTS OF ASPHERIC SURFACES | k | A | B | C |
|---|---|---|---|---|
| MIRROR 110 | −3.9998 | 7.08463E−10 | −3.34178E−15 | 2.26899E−20 |
| MIRROR 120 | 1.49768 | −1.45489E−10 | −3.35068E−16 | −1.40824E−21 |
| MIRROR 130 | −0.94917 | 2.92201E−9 | 3.54949E−14 | 7.05051E−20 |
| MIRROR 140 | −0.38700 | 2.15931E−11 | 9.38093E−16 | −1.09193E−21 |
| MIRROR 150 | −0.51003 | 1.79927E−10 | 1.48258E−16 | 4.96882E−21 |
| MIRROR 160 | −2.05871 | 5.70806E−9 | −5.76999E−14 | 6.93548E−19 |
| MIRROR 170 | 9.90823 | −3.34740E−10 | 1.34731E−13 | −3.13461E−18 |
| MIRROR 180 | 0.15422 | −1.54836E−10 | −8.21875E−16 | −4.58847E−21 |

| | D | E | F | G |
|---|---|---|---|---|
| MIRROR 110 | −1.14365E−25 | −5.97060E−31 | 1.73108E−35 | −1.18400E−40 |
| MIRROR 120 | 1.41354E−27 | −4.77486E−31 | 5.95018E−36 | −7.17698E−41 |
| MIRROR 130 | 7.34271E−24 | −1.06893E−28 | 2.55011E−33 | −1.72612E−38 |
| MIRROR 140 | 6.32962E−27 | −9.52122E−33 | 4.92155E−39 | 3.79060E−44 |
| MIRROR 150 | 1.90325E−27 | −7.14255E−32 | 4.10891E−37 | −3.15996E−43 |
| MIRROR 160 | 8.47769E−25 | −2.65715E−28 | 4.59473E−33 | −2.61818E−38 |
| MIRROR 170 | 2.30514E−22 | −8.90541E−26 | 1.05391E−29 | −7.01036E−34 |

TABLE 1-continued

| MIRROR 180 | −3.61962E−26 | 1.18804E−31 | −5.81515E−36 | 3.05021E−41 |

| MIRROR NUMBER | MAXIMUM INCIDENT ANGLE (DEGREE) |
|---|---|
| MIRROR 110 | 16.0 |
| MIRROR 120 | 11.3 |
| MIRROR 130 | 29.5 |
| MIRROR 140 | 29.5 |

Referring to Table 1, it is understood that the largest incident angle is 42° at the sixth mirror 160 among all the mirrors, which is smaller by 10° or greater, than the conventional eight-mirror system. Referring to FIG. 5, it is understood that the aberration is corrected to a non-aberrational state.

The catoptric projection optical system 100 shown in FIG. 1 includes such aberrations (calculated at several points on the image point) without manufacture errors that (wave front aberration)=0.008 λrms and |maximum distortion| is 2.4 nm. This is a diffraction limited optical system for a wavelength of 13.4 nm irrespective of extremely high NA of 0.50.

Figure 6:
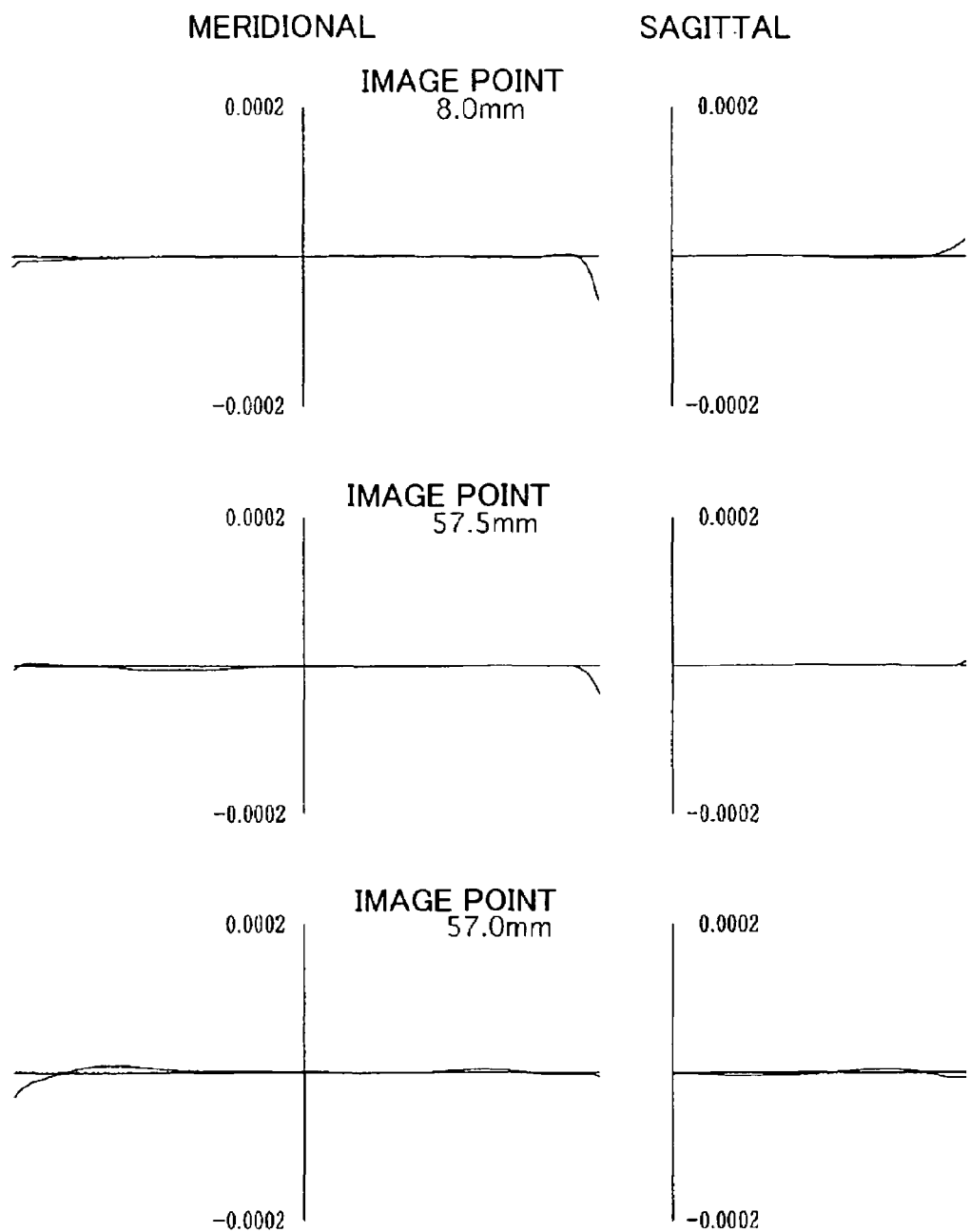
FIG. 6 is an aberrational diagram of the catoptric projection optical system shown in FIG. 2.

The catoptric projection optical system 100A shown in FIG. 2 has NA of 0.50, a span of 1156 mm, a reduction of ⅕, an object point of 285 to 290 mm, an image point of 57 to 58 mm, and an arc-shaped image surface with a width of 1.0 mm. Table 2 indicates the numerical values (such as radius of curvature, surface intervals, coefficients of aspheric surfaces, and values of a conditional expression) of the catoptric projection optical system 100A shown in FIG. 2. FIG. 6 shows an aberrational diagram of the catoptric projection optical system 100A shown in FIG. 2.

TABLE 2

| MIRROR | RADII OF CURVATURE | SURFACE INTERVALS | |
|---|---|---|---|
| OBJECT SURFACE (MS) | ∞ | 726.20511 | d1 |
| MIRROR 110 | 5216.71979 | −561.83308 | d2 |
| MIRROR 120 | 963.67601 | 34.67002 | d3 |
| | | | (=492.55137) |
| STOP (ST) | ∞ | 457.88135 | |
| MIRROR 130 | 376.09665 | −309.88006 | d4 |
| MIRROR 140 | 997.64152 | 782.34836 | d5 |
| MIRROR 150 | −1255.70705 | −382.46830 | d6 |
| MIRROR 160 | −2177.92776 | 369.47983 | d7 |
| MIRROR 170 | 530.05905 | −344.47983 | d8 |
| MIRROR 180 | 435.65184 | 384.47983 | |
| IMAGE SURFACE (W) | ∞ | | |

| COEFFICIENTS OF ASPHERIC SURFACES | k | A | B | C |
|---|---|---|---|---|
| MIRROR 110 | −3.65466 | 1.63073E−9 | −1.49576E−14 | 1.52573E−19 |
| MIRROR 120 | 1.16489 | −1.94962E−10 | −4.64356E−16 | −1.30892E−21 |
| MIRROR 130 | −1.04946 | 3.47277E−9 | 2.49462E−14 | 1.16196E−19 |
| MIRROR 140 | −0.34382 | 2.19815E−10 | 1.67568E−16 | −1.14145E−23 |
| MIRROR 150 | 2.73373 | 4.71206E−10 | 5.17335E−16 | 3.99300E−21 |
| MIRROR 160 | 9.03849 | 5.75314E−9 | −8.39497E−14 | 7.82903E−19 |
| MIRROR 170 | 8.71390 | −2.62883E−9 | 8.15892E−14 | −2.23847E−18 |
| MIRROR 180 | 0.16213 | −1.35593E−10 | −6.21776E−16 | −2.92087E−21 |

| | D | E | F | G |
|---|---|---|---|---|
| MIRROR 110 | −1.38647E−24 | 4.49607E−30 | 1.12939E−34 | −1.44006E−39 |
| MIRROR 120 | −3.35534E−27 | −5.36808E−31 | 5.31982E−36 | −1.31204E−40 |
| MIRROR 130 | 4.83280E−24 | −1.10087E−28 | 3.06869E−33 | −2.95007E−38 |
| MIRROR 140 | 8.62662E−28 | −2.11861E−33 | 4.59815E−39 | −3.21797E−45 |
| MIRROR 150 | −1.09786E−26 | 2.71956E−32 | 8.53382E−38 | −1.60618E−43 |
| MIRROR 160 | 8.62164E−24 | −2.70094E−28 | 1.39208E−33 | 6.31182E−39 |
| MIRROR 170 | 9.54626E−23 | −2.94405E−26 | 3.14556E−30 | −1.81432E−34 |
| MIRROR 180 | −1.88161E−26 | 2.05434E−32 | −1.64918E−36 | 4.22940E−42 |

| MIRROR NUMBER | MAXIMUM INCIDENT ANGLE (DEGREE) |
|---|---|
| MIRROR 110 | 18.4 |
| MIRROR 120 | 11.4 |
| MIRROR 130 | 26.6 |
| MIRROR 140 | 23.1 |

Referring to Table 2, it is understood that the largest incident angle is 32.3° at the seventh mirror 170 among all the mirrors, which is smaller by 20° or greater, than the conventional eight-mirror system. Referring to FIG. 6, it is understood that the aberration is corrected to a non-aberrational state.

The catoptric projection optical system 100A shown in FIG. 2 includes such aberrations (calculated at several points on the image point) without manufacture errors that (wave front aberration)=0.015 λrms and |maximum distortion|=1.0 nm. This is a diffraction limited optical system for a wavelength of 13.4 nm irrespective of extremely high NA of 0.50.

Figure 7:
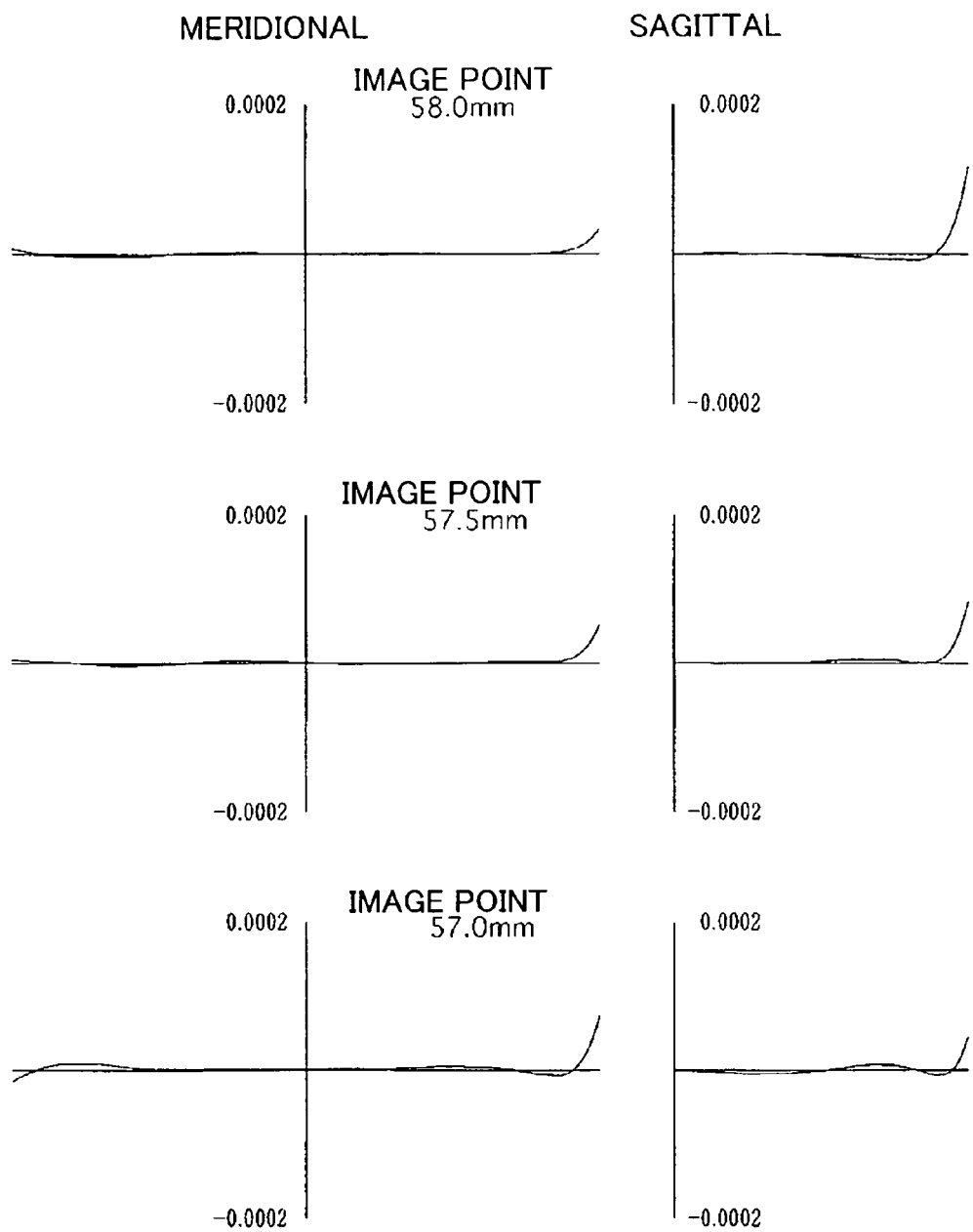
FIG. 7 is an aberrational diagram of the catoptric projection optical system shown in FIG. 3.

The catoptric projection optical system 100B shown in FIG. 3 has NA of 0.50, a span of 1315 mm, a reduction of ⅕, an object point of 285 to 290 mm, an image point of 57 to 58 mm, and an arc-shaped image surface with a width of 1.0 mm. Table 3 indicates the numerical values (such as radius of curvature, surface intervals, coefficients of aspheric surfaces, and values of a conditional expression) of the catoptric projection optical system 100B shown in FIG. 3. FIG. 7 shows an aberrational diagram of the catoptric projection optical system 100B shown in FIG. 3.

TABLE 3

| MIRROR | RADII OF CURVATURE | SURFACE INTERVALS | |
|---|---|---|---|
| OBJECT SURFACE (MS) | ∞ | 800.00000 | d1 |
| MIRROR 110 | −6596.61807 | −400.00000 | d2 |
| MIRROR 120 | 944.36675 | 10.40623 | d3 |
| | | | (=388.01785) |
| STOP (ST) | ∞ | 377.61162 | |
| MIRROR 130 | 376.68188 | −317.25435 | d4 |
| MIRROR 140 | 905.87411 | 713.54887 | d5 |
| MIRROR 150 | −1272.87295 | −306.29452 | d6 |
| MIRROR 160 | −1828.76691 | 397.11186 | d7 |
| MIRROR 170 | 478.53394 | −372.11186 | d8 |
| MIRROR 180 | 464.15665 | 412.11186 | |
| IMAGE SURFACE (W) | ∞ | | |

| COEFFICIENTS OF ASPHERIC SURFACES | k | A | B | C |
|---|---|---|---|---|
| MIRROR 110 | 4.56738 | 1.83244E−9 | −2.01836E−14 | 2.56470E−19 |
| MIRROR 120 | 1.22586 | −2.12071E−10 | −1.48973E−15 | 5.31630E−21 |
| MIRROR 130 | −1.35020 | 2.68788E−9 | 3.43817E−14 | 1.36334E−19 |
| MIRROR 140 | −0.48972 | 8.95669E−11 | 2.34393E−16 | 3.44970E−22 |
| MIRROR 150 | 2.27002 | 4.31614E−10 | 1.35068E−15 | 4.58111E−21 |
| MIRROR 160 | 8.85971 | 5.79266E−9 | −8.25896E−14 | 6.96590E−19 |
| MIRROR 170 | 7.36115 | −5.82425E−9 | 1.23430E−13 | −3.94589E−18 |
| MIRROR 180 | 0.16294 | −1.23739E−10 | −4.85845E−16 | 2.18713E−21 |

| | D | E | F | G |
|---|---|---|---|---|
| MIRROR 110 | −3.00945E−24 | 1.84741E−29 | 9.04302E−35 | −1.71018E−39 |
| MIRROR 120 | −5.41251E−26 | −9.18186E−30 | 1.91856E−34 | −3.14390E−39 |
| MIRROR 130 | −5.77798E−24 | 2.39984E−28 | −2.44927E−33 | 1.61257E−38 |
| MIRROR 140 | 1.07561E−28 | −2.62589E−33 | 1.25181E−38 | −1.20242E−44 |
| MIRROR 150 | −1.23676E−25 | 1.30469E−30 | −5.88016E−36 | 1.04386E−41 |
| MIRROR 160 | 7.30088E−24 | −2.21642E−28 | 1.80368E−33 | −4.78533E−39 |
| MIRROR 170 | −2.87637E−22 | 3.97720E−26 | −2.60325E−30 | 4.32622E−35 |
| MIRROR 180 | −9.32557E−27 | −6.41787E−32 | 1.46025E−37 | −3.62381E−42 |

| MIRROR NUMBER | MAXIMUM INCIDENT ANGLE (DEGREE) |
|---|---|
| MIRROR 110 | 18.7 |
| MIRROR 120 | 15.5 |
| MIRROR 130 | 30.0 |
| MIRROR 140 | 21.9 |

Referring to Table 3, it is understood that the largest incident angle is 31.6° at the seventh mirror 170 among all the mirrors, which is smaller by 20° or greater, than the conventional eight-mirror system. Referring to FIG. 7, it is understood that the aberration is corrected to a non-aberrational state.

The catoptric projection optical system 100A shown in FIG. 3 includes such aberrations (calculated at several points on the image point) without manufacture errors that (wave front aberration)=0.026 λrms and |maximum distortion|=1.5 nm. This is a diffraction limited optical system for a wavelength of 13.4 nm irrespective of extremely high NA of 0.50.

As discussed, the inventive catoptric projection optical system 100 uses a wavelength of EUV light, achieves performance of refractive limits with extremely higher NA, such as about 0.5, than the conventional, and reduces the largest incident angle by 10 to 20.

Figure 8:
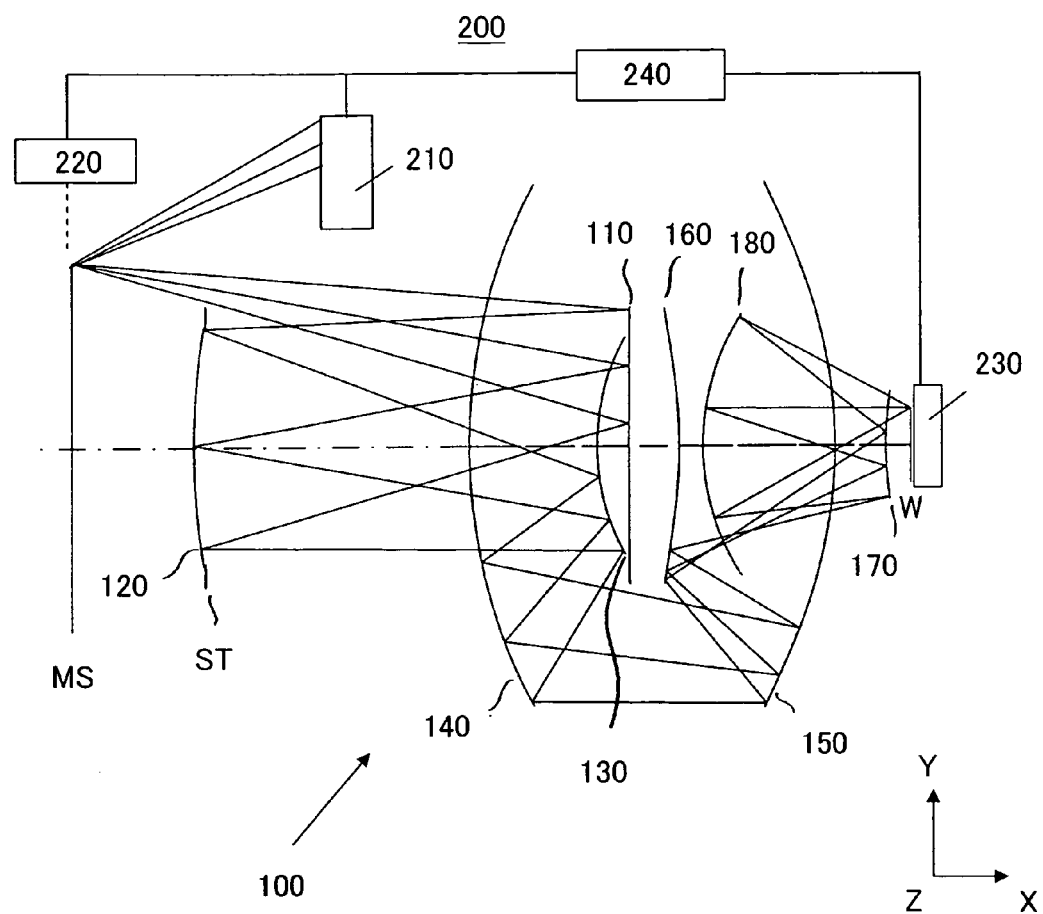
FIG. 8 is a schematic block diagram showing an exposure apparatus that includes the catoptric projection optical system shown in FIG. 1.

A description will be given below of an exposure apparatus 200 including the inventive catoptric projection optical system 100 with reference to FIG. 8. Here, FIG. 8 is a schematic block diagram showing an exposure apparatus 200 that includes a catoptric projection optical system 100. The exposure apparatus 200 is a projection exposure apparatus that uses the EUV light (with a wavelength, for example, of 13.4 nm) as illumination light for step-and-scan exposure.

The exposure apparatus 200 includes, as shown in FIG. 8, an illumination apparatus 210, a mask MS, a mask stage 220 that is mounted with the mask MS, a catoptric projection optical system 100, an object W to be exposed, a wafer stage 230 that is mounted with the object W, and a controller 240. The controller 240 is connected controllably to the illumination apparatus 210, mask stage 220 and wafer stage 230.

At least the optical path through which the EUV light travels should preferably be maintained in a vacuum atmosphere, although not shown in FIG. 8, since the EUV light has low transmittance for air. In FIG. 8, XYZ define a three-dimensional space, and the Z direction is a normal direction of an XY plane.

The illumination apparatus 210 uses the EUV light (with a wavelength of, for example, 13.4 nm) corresponding to an arc-shaped field of the catoptric projection optical system 100 to illuminate the mask MS, and includes a light source and an illumination optical system. The light source and illumination optical system in the illumination apparatus 210 may use any technology known in the art, and a description thereof will be omitted in this specification. For example, the illumination optical system includes a condenser optical system, an optical integrator, an aperture stop, a blade, etc., and may apply any technology conceivable to those skilled in the art.

The mask MS is a transmission type or a catoptric type mask, and forms a circuit pattern (or image) to be transferred. It is supported and driven by the mask stage 220. The diffracted light emitted from the mask MS is projected onto the object W after reflected by the catoptric projection optical system 100. The mask MS and the object W are arranged optically conjugate with each other. Since the exposure apparatus 200 is a step-and-scan exposure apparatus, the mask MS and the object W are scanned with a reduction speed ratio to transfer a pattern on the mask MS onto the object W.

The mask stage 220 supports the mask MS, and is connected to a transport mechanism (not shown). The mask stage 220 can use any structure known in the art. The transport mechanism (not shown) is made up of a linear motor and the like, and drives the mask stage 220 at least in the Y direction under control of the controller 240, thus moving the mask MS. The exposure apparatus 200 scans the mask MS and the object W in a state synchronized by the controller 240.

The catoptric projection optical system 100 is one that projects a pattern on the mask MS onto an image surface in a reduced size. The catoptric projection optical system 100 may use any of the above structures, and a detailed description thereof will be omitted. Although FIG. 8 uses the projection optical system 100 shown in FIG. 1, this embodiment is illustrative and the present invention is not limited to this embodiment.

The object W is a wafer in this embodiment, but may broadly cover a LCD and other objects to be exposed. Photoresist is applied onto the object W.

The object W is supported by the wafer stage 230. The wafer stage 230 may use, for example, a linear motor to move the object W in the XYZ directions. The mask MS and object W are controlled by the controller 240, and scanned synchronously. Positions of the mask stage 220 and wafer stage 230 are monitored, for example, by a laser interferometer and the like, so that both are driven at a constant speed ratio.

The controller 240 includes a CPU and memory (not shown), and controls actions of the exposure apparatus 200. The controller 240 is electrically connected to the illumination apparatus 210, the mask stage 220, i.e., a transport mechanism (not shown) of the mask stage 220, and the wafer stage 230, i.e., a transport mechanism (not shown) of the wafer stage 230. The CPU includes any processor irrespective of its name, such as an MPU, and controls an operation of each component. The memory includes a ROM and a RAM for storing firmware necessary for operations of the exposure apparatus 200.

In exposure, the EUV light emitted from the illumination apparatus 210 illuminates the mask MS, and images a pattern on the mask MS onto the object W. In the instant embodiment, the image surface has an arc or ring shape, and scanning of the mask MS and the object at a speed ratio corresponding to a reduction ratio provides exposure of an entire surface of the mask MS.

Figure 9:
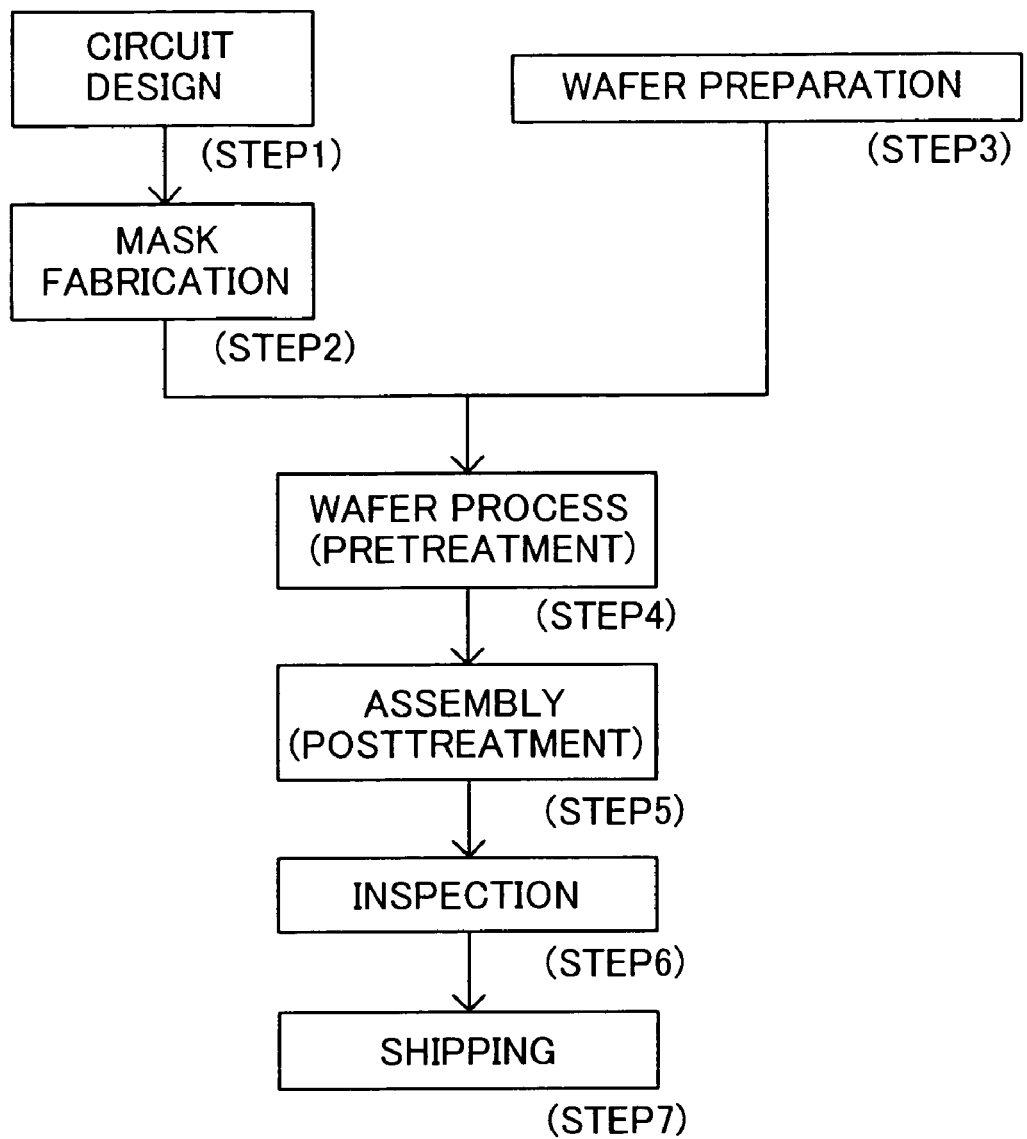
FIG. 9 is a flowchart for explaining a method for fabricating devices (semiconductor chips such as ICs, LSIs, and the like, LCDs, CCDs, etc.).
Figure 10:
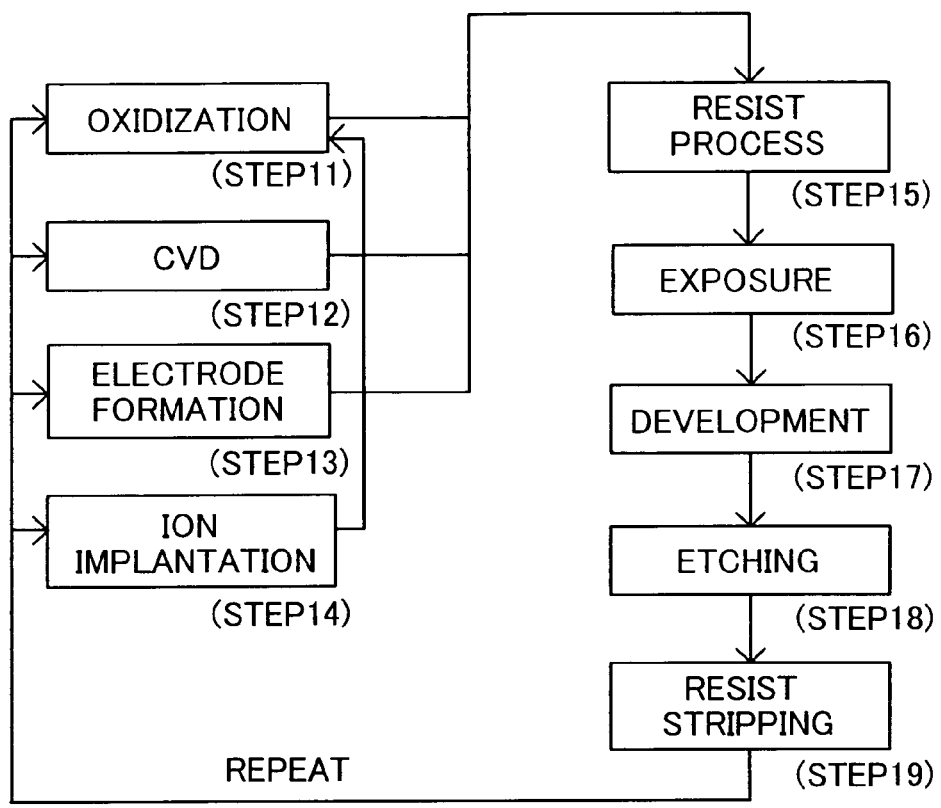
FIG. 10 is a detailed flowchart for Step 4 of wafer process shown in FIG. 9.
Figure 11:
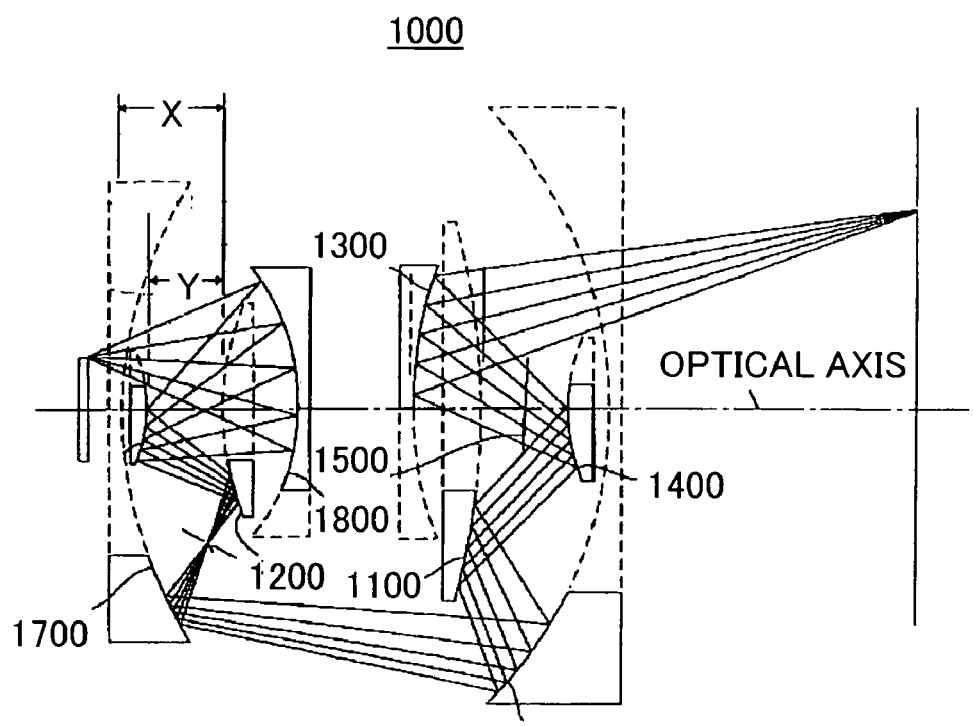
FIG. 11 is a schematic sectional view of a conventional eight-mirror catoptric projection optical system.

Referring to FIGS. 9 and 10, a description will now be given of an embodiment of a device fabrication method using the above exposure apparatus 200. FIG. 9 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 10 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one. Thus, the device fabrication method using the exposure apparatus 200, and the devices as finished goods also constitute one aspect of the present invention.

Further, the present invention is not limited to these preferred embodiments, and various variations and modifications may be made without departing from the scope of the present invention. For example, the catoptric projection optical system of this embodiment has a coaxial system having a rotationally symmetrical aspheric surface, but the present invention is not limited to this embodiment and it may have a rotationally asymmetrical aspheric surface. Each mirror in the catoptric projection optical system does not have to be arranged as a perfect coaxial system so as to correct or adjust aberration. For example, they may slightly decenter for aberrational improvements. The present invention is applicable a catoptric projection optical system for non-EUV ultraviolet light with a wavelength of 200 nm or less, such as ArF excimer laser and $F_2$ excimer laser, as well as to an exposure apparatus that scans and exposes a large screen, or that exposes without scanning.

According to the inventive catoptric projection optical system, the eight-mirror system may provide high NA and reduce a maximum incident angle on a reflective surface, which is desirable for an angular characteristic of the multilayer film layered in the reflective surface. As a result, the light intensity is reduced on the wafer, and the non-uniform light intensity and resolution may be reduced. A minimum distance between the object surface and the mirror is sufficiently secured and prevents interference among mirrors or mirror barrel of the projection optical system, a stage mechanism for the object surface, and an illumination optical system. Thereby, the inventive catoptric projection optical system serves as an optical system that has good imaging performance with high NA, and the exposure apparatus that utilizes this catoptric projection optical system may provide high quality devices with excellent exposure performance.

What is claimed is:

1. A catoptric projection optical system for projecting a reduced image of a pattern on an object surface onto an image surface, said catoptric projection optical system comprising eight mirrors that includes, in order from the object surface side to the image surface side, a first mirror, a second mirror, a third mirror, a fourth mirror, a fifth mirror, a sixth mirror, a seventh mirror, and an eighth mirror, and forming an intermediate image between said sixth mirror and said seventh mirror on an optical path, wherein a position in a height direction of a principal ray from an optical axis at each mirror displaces, and a displacement direction from the first mirror to said fourth mirror is reverse to that from said fifth mirror to said eight mirror, wherein said second to fifth mirrors are concave, convex, concave and concave mirrors, respectively, and said seventh and eighth mirrors are convex and concave mirrors, respectively, and wherein said second mirror among these eight mirrors is located closest to the object surface side.

2. A catoptric projection optical system according to claim 1, wherein the largest incident angle upon a meridional section is equal to or smaller than 45° on an effective light reflective surface from said first mirror to said sixth mirror.

3. A catoptric projection optical system according to claim 1, wherein said projection optical system meets $0.45 < |d2/d1| < 0.8$, where d1 is a distance from the object surface to said first mirror, and d2 is a distance from said first mirror to said second mirror.

4. A catoptric projection optical system according to claim 1, wherein said projection optical system meets $1.0 < |d7/d8| < 1.2$, where d7 is a distance from said sixth mirror to said seventh mirror, and d8 is a distance from said seventh mirror to said eighth mirror.

5. A catoptric projection optical system according to claim 1, wherein said projection optical system meets $0.75 < |d6/d8| < 1.2$, where d6 is a distance from said fifth mirror to said sixth mirror, and d8 is a distance from said seventh mirror to said eighth mirror.

6. A catoptric projection optical system according to claim 1, wherein said projection optical system meets $-5.0 < \alpha < 10.0$, where $\alpha$ is an angle (degree) between the principal ray at the largest image point from said fourth mirror to said fifth mirror, and the optical axis, and clockwise and counterclockwise rotations from a parallel line to the optical axis which starts from a principal ray position at said fifth mirror are defined as positive and negative, respectively.

7. A catoptric projection optical system according to claim 1, wherein said sixth mirror is a convex mirror.

8. A catoptric projection optical system according to claim 1, wherein an optical-axis position of said sixth mirror is physically located closer to the image surface than an optical-axis position of said first mirror.

9. A catoptric projection optical system according to claim 1, wherein a position of said second mirror is an aperture stop position.

10. A catoptric projection optical system according to claim 1, wherein said eight mirrors are substantially arranged as a coaxial system.

11. A catoptric projection optical system according to claim 10, wherein said catoptric projection optical system is telecentric at the image surface side.

12. A catoptric projection optical system according to claim 1, wherein at least one of said eight mirrors includes an aspheric mirror including a multilayer film for reflecting extreme ultraviolet light.

13. A catoptric projection optical system according to claim 1, wherein all of said eight mirrors include aspheric mirrors each including a multilayer film for reflecting extreme ultraviolet light.

14. A catoptric projection optical system according to claim 1, wherein the light is extreme ultraviolet light having a wavelength of 20 nm or smaller.

15. A catoptric projection optical system according to claim 1, wherein said projection optical system has a numerical aperture of 0.3 or greater.

16. A catoptric projection optical system for projecting a reduced image of a pattern on an object surface onto an image surface, said catoptric projection optical system comprising eight mirrors that includes, in order from the object surface side to the image surface side, a first mirror, a second mirror, a third mirror, a fourth mirror, a fifth mirror, a sixth mirror, a seventh mirror, and an eighth mirror, and forming an intermediate image between said sixth mirror and said seventh mirror on an optical path,
  wherein a position in a height direction of a principal ray from an optical axis at each mirror displaces, and a displacement direction from said first mirror to said fourth mirror is the reverse to that from said fifth mirror to said eighth mirror,
  wherein said second to fifth mirrors are concave, convex, concave, and concave mirrors, respectively, and said seventh and eighth mirrors are convex and concave mirrors, respectively,
  wherein said second mirror among these eight mirrors is located closest to the object surface side, and
  wherein said projection optical system meets $0.3<|d4/d3|<1.0$, where d3 is a distance from said second mirror to said third mirror, and d4 is a distance from said third mirror to said fourth mirror.

17. An exposure apparatus comprising:
  a catoptric projection optical system according to claim 6;
  a stage for positioning a mask at the object surface and for holding the mask;
  a stage for positioning at the image surface a photosensitive layer of an object to be exposed, and for holding the object;
  an illumination apparatus that illuminates the mask using arc-shaped EUV light having an arc-shaped field of said catoptric projection optical system; and
  a mechanism for synchronously scanning each stage while the mask is illuminated by the EUV light.

18. A device fabrication method comprising the steps of:
exposing an object using an exposure apparatus according to claim 17; and
developing the object that is exposed.

19. An exposure apparatus comprising:
  a catoptric projection optical system for projecting a reduced image of a pattern on an object surface onto an image surface, said catoptric projection optical system comprising eight mirrors that includes, in order from the object surface side to the image surface side, a first mirror, a second mirror, a third mirror, a fourth mirror, a fifth mirror, a sixth mirror, a seventh mirror, and an eighth mirror, and forming an intermediate image between said sixth mirror and said seventh mirror on an optical path, wherein a position in a height direction of a principal ray from an optical axis at each mirror displaces, and a displacement direction from the first mirror to said fourth mirror is reverse to that from said fifth mirror to said eight mirror, wherein said second to fifth mirrors are concave, convex, concave and concave mirrors, respectively, and said seventh and eighth mirrors are convex and concave mirrors, respectively, and wherein said second mirror among these eight mirrors is located closest to the object surface side;
  a stage for positioning a mask at the object surface and for holding the mask;
  a stage for positioning at the image surface a photosensitive layer of an object to be exposed, and for holding the object;
  an illumination apparatus that illuminates the mask using arc-shaped EUV light having an arc-shaped field of said catoptric projection optical system; and
  a mechanism for synchronously scanning each stage while the mask is illuminated by the EUV light.

20. A device fabrication method comprising the steps of:
exposing an object using an exposure apparatus; and
developing the object that is exposed,
wherein said exposure apparatus includes:
  a catoptric projection optical system for projecting a reduced size of a pattern on an object surface onto an image surface, said catoptric projection optical system comprising eight mirrors that includes, in order from the object surface side to the image surface side, a first mirror, a second mirror, a third mirror, a fourth mirror, a fifth mirror, a sixth mirror, a seventh mirror, and an eighth mirror, and forming an intermediate image between said sixth mirror and said seventh mirror on an optical path, wherein a position in a height direction of a principal ray from an optical axis at each mirror displaces, and a displacement direction from the first mirror to said fourth mirror is reverse to that from said fifth mirror to said eight mirror, wherein said second to fifth mirrors are concave, convex, concave and concave mirrors, respectively, and said seventh and eighth mirrors are convex and concave mirrors, respectively, and wherein said second mirror among these eight mirrors is located closest to the object surface side;
  a stage for positioning a mask at the object surface and for holding the mask;
  a stage for positioning at the image surface a photosensitive layer of an object to be exposed, and for holding the object; and
  a mechanism for synchronously scanning each stage while the mask is illuminated by the light.

21. A catoptric projection optical system for projecting a reduced image of a pattern on an object surface onto an image surface, said catoptric projection optical system, in order from the object surface side to the image surface side, comprising:
  a first mirror;
  a second mirror for having a concave reflection surface;
  a third mirror for having a convex reflection surface;
  a fourth mirror for having a concave reflection surface;
  a fifth mirror for having concave reflection surface;
  a sixth mirror;
  a seventh mirror for having a convex reflection surface; and
  a eighth mirror for having a concave reflection surface,
  wherein an intermediate image between said sixth mirror and said
  seventh mirror on an optical path,
  wherein a position in a height direction of a principal ray from an optical axis at each mirror displaces, and a displacement direction from the first mirror to said fourth mirror is reverse to that from said fifth mirror to said eight mirror, wherein said second mirror among these eight mirror is located closest to the object surface side, wherein said projection optical system meets $0.75<|d6/d8|<1.2$, where d6 is a distance from said fifth mirror to said sixth mirror, and d8 is a distance from said seventh mirror to said eighth mirror.

22. A catoptric projection optical system according to claim 21, wherein said projection optical system meets $0.45<|d2/d1|<0.8$, where d1 is a distance from the object surface to said first mirror, and d2 is a distance from said first mirror to said second mirror.

23. A catoptric projection optical system according to claim 21, wherein said projection optical system meets $1.0<|d7/d8|<1.2$, where d7 is a distance from said sixth mirror to said seventh mirror, and d8 is a distance from said seventh mirror to said eighth mirror.

24. A catoptric projection optical system according to claim 21, wherein said projection optical system meets $0.3<|d4/d3|<1.0$, where d3 is a distance from said second mirror to said third mirror, and d4 is a distance from said third mirror to said fourth mirror.

25. An exposure apparatus comprising:
a catoptric projection optical system according to claim 21;
a stage for positioning a mask at the object surface and for holding the mask;
a stage for positioning at the image surface a photosensitive layer of an object to be exposed, and for holding the object;
an illumination apparatus that illuminates the mask using arc-shaped EUV light having an arc-shaped field of said catoptric projection optical system; and
a mechanism for synchronously scanning each stage while the mask is illuminated by the EUV light.

26. A device fabrication method comprising the steps of:
exposing an object using an exposure apparatus according to claim 25; and
developing the object that is exposed.

27. A catoptric projection optical system for projecting a reduced image of a pattern on an object surface onto an image surface, said catoptric projection optical system, in order from the object surface side to the image surface side, comprising:

a first mirror;
a second mirror for having a concave reflection surface;
a third mirror for having a convex reflection surface;
a fourth mirror for having a concave reflection surface;
a fifth mirror for having concave reflection surface;
a sixth mirror;
a seventh mirror for having a convex reflection surface; and
a eighth mirror for having a concave reflection surface,
wherein an intermediate image between said sixth mirror and said seventh mirror on an optical path,
wherein a position in a height direction of a principal ray from an optical axis at each mirror displaces, and a displacement direction from the first mirror to said fourth mirror is reverse to that from said fifth mirror to said eight mirror,
wherein said second mirror among these eight mirrors is located closest to the object surface side,
wherein said projection optical system meets $1.0<|d7/d8|<1.2$, where d7 is a distance from said sixth mirror to said seventh mirror, and d8 is a distance from said seventh mirror to said eighth mirror.

28. An exposure apparatus comprising;
a catoptric projection optical system according to claim 27;
a stage for positioning a mask at the object surface and for holding the mask;
a stage for positioning at the image surface a photosensitive layer of an object to be exposed, and for holding the object;
an illumination apparatus that illuminates the mask using arc-shaped EUV light having an arc-shaped field of said catoptric projection optical system; and
a mechanism for synchronously scanning each stage while the mask is illuminated by the EUV light.

29. A device fabrication method comprising the steps of:
exposing an object using an exposure apparatus according to claim 28; and
developing the object that is exposed.

* * * * *